US012748151B2

(12) United States Patent
Yen

(10) Patent No.: US 12,748,151 B2
(45) Date of Patent: Sep. 29, 2026

(54) SMART BATTERY TEMPERATURE COMPENSATION METHOD

(71) Applicant: Quanta Computer Inc., Taoyuan City (TW)

(72) Inventor: Wei-Ting Yen, Taoyuan City (TW)

(73) Assignee: QUANTA COMPUTER INC., Taoyuan City (TW)

( * ) Notice: Subject to any disclaimer, the term of this patent is extended or adjusted under 35 U.S.C. 154(b) by 721 days.

(21) Appl. No.: 18/312,001

(22) Filed: May 4, 2023

(65) Prior Publication Data

US 2024/0241181 A1 Jul. 18, 2024

(30) Foreign Application Priority Data

Jan. 17, 2023 (TW) ................................ 112101957

(51) Int. Cl.

*H01M 10/613* (2014.01)
*G01R 31/367* (2019.01)
*G06F 1/20* (2006.01)
*H01M 10/633* (2014.01)
*H01M 10/6563* (2014.01)

(52) U.S. Cl.

CPC ........... *G01R 31/367* (2019.01); *G06F 1/206* (2013.01); *H01M 10/613* (2015.04); *H01M 10/633* (2015.04); *H01M 10/6563* (2015.04)

(58) Field of Classification Search

CPC ... H01M 10/613; H01M 10/633; H01M 10/62
See application file for complete search history.

(56) References Cited

U.S. PATENT DOCUMENTS

2005/0202310 A1* 9/2005 Yahnker ................ H01M 50/24 429/62
2007/0120537 A1 5/2007 Yamamoto
2007/0298315 A1 12/2007 Yamamoto
2020/0161726 A1 5/2020 Liang et al.
(Continued)

FOREIGN PATENT DOCUMENTS

CN 108418265 A 8/2018
JP 2001-313092 A 11/2001
TW 202021224 A 6/2020

OTHER PUBLICATIONS

Chinese language office action dated Jan. 16, 2024, issued in application No. TW 112101957.
(Continued)

*Primary Examiner* — Kenneth J Douyette
(74) *Attorney, Agent, or Firm* — McClure, Qualey & Rodack, LLP

(57) ABSTRACT

A smart battery temperature compensation method includes detecting a battery temperature of a battery device in an electronic device; determining whether a difference between the battery temperature of the battery device and a simulated battery temperature is within a tolerance value; and when it is determined that the difference between the battery temperature of the battery device and the simulated battery temperature is not within the tolerance value, a multi-level cooling operation is performed until the difference between the battery temperature of the battery device and the simulated battery temperature is within the tolerance value.

9 Claims, 9 Drawing Sheets

104

(56) References Cited

U.S. PATENT DOCUMENTS

2020/0313256 A1 10/2020 Kuronuma

OTHER PUBLICATIONS

Japanese language office action dated Dec. 30, 2024, issued in application No. JP 2023-149364.

Extended European Search Report dated Jul. 12, 2024, issued in application No. EP 23175986.1.

Japanese language office action dated Aug. 6, 2024, issued in application No. JP 2023-149364.

* cited by examiner

SMART BATTERY TEMPERATURE COMPENSATION METHOD

CROSS REFERENCE TO RELATED APPLICATIONS

This Application claims priority of Taiwan patent application Ser. No. 112101957, filed on Jan. 17, 2023, the entirety of which is incorporated by reference herein.

BACKGROUND OF THE INVENTION

Field of the Invention

The present invention relates to battery temperature compensation method, and, in particular, to a battery temperature compensation method that uses multiple cooling operations to match the battery temperature with the simulated battery temperature.

Description of the Related Art

With the development of technology, many existing electronic devices such as servers, electric vehicles, and mobile devices are powered by battery devices. A temperature sensor is usually disposed in the battery device to detect the battery temperature of the battery device in these electronic devices. The detected battery temperature can be used for various applications. For example, it can be determined whether the battery is at an undesirably high temperature, so that various protection mechanisms can be employed to prevent the battery from being damaged.

However, the battery device in the existing electronic device has a large area, and a temperature sensor only uses one detection point at which to detect the battery temperature of the battery device. In other words, the battery temperature as detected by the temperature sensor is not the average battery temperature of the entire battery device. Therefore, there is a need for a method for compensating the battery temperature to match the detected battery temperature to a simulated battery temperature.

BRIEF SUMMARY OF THE INVENTION

The present disclosure provides a smart battery temperature compensation method. The smart battery temperature compensation method includes detecting a battery temperature of a battery device in an electronic device; and determining whether a difference between the battery temperature and a simulated battery temperature of the battery device is within a tolerance value. The simulated battery temperature is simulated according to a current power consumption of the electronic device. The smart battery temperature compensation method further includes when it is determined that the difference between the battery temperature of the battery device and the simulated battery temperature is not within the tolerance value, performing a multi-level cooling operation until the difference between the battery temperature of the battery device and the simulated battery temperature is within the tolerance value.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only exemplary aspects of the disclosure and are not therefore to be considered to be limiting of its scope, the principles herein are described and explained with additional specificity and detail through the use of the accompanying drawings.

DETAILED DESCRIPTION OF THE INVENTION

Figure 1:
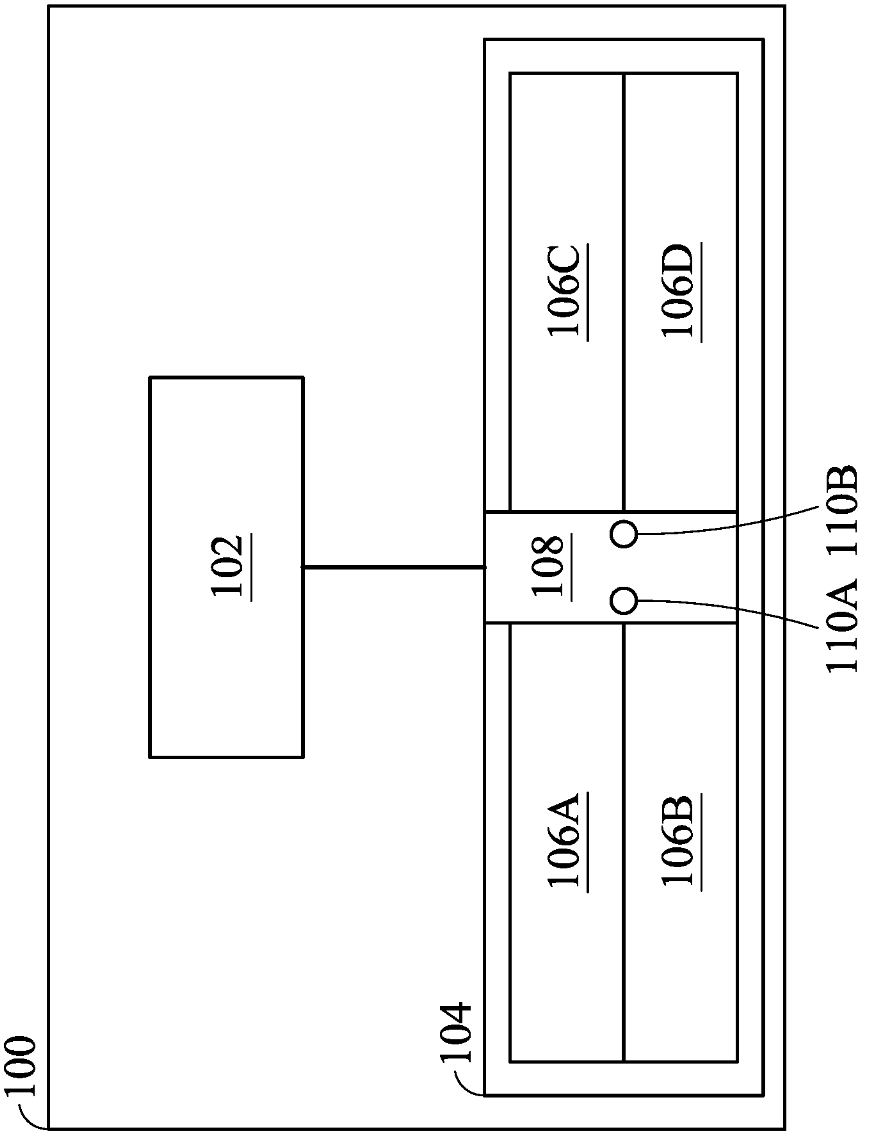
FIG. 1 illustrates a schematic diagram of an electronic device, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For purposes of the present detailed description, unless specifically disclaimed, the singular includes the plural and vice versa; and the word “including” means “including without limitation.” Moreover, words of approximation, such as “about,” “almost,” “substantially,” “approximately,” and the like, can be used herein to mean “at, near, or nearly at,” or “within 3-5% of,” or “within acceptable manufacturing tolerances,” or any logical combination thereof, for example.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The terminology used herein is for the purpose of describing particular embodiments only, and is not intended to be limiting of the invention. As used herein, the singular forms "a", "an" and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore terms, such as those defined in commonly used dictionaries, should be interpreted as having a meaning that is consistent with their meaning in the context of the relevant art, and will not be interpreted in an idealized or overly formal sense unless expressly so defined herein.

FIG. 1 illustrates a schematic diagram of an electronic device 100, in accordance with some embodiments of the present disclosure. The electronic device 100 includes a processor 102 and a battery device 104. The battery device 104 further includes battery cells 106A, 106B, 106C, and 106D (may be collectively referred to as battery cells 106), a circuit board 108, and temperature sensors 110A and 110B (may be collectively referred to as temperature sensors 110). The battery device 104 is coupled to the processor 102 to communicate with the electronic device 100. Specifically, the battery cells 106 are connected to the circuit board 108, and the temperature sensors 110 are disposed on the circuit board 108. The circuit board 108 is coupled to the processor 102, so that the power stored in the battery cells 106 may be transmitted to the processor 102 of the electronic device 100, and the battery temperature of the battery device 104 sensed by the temperature sensors 110 may be transmitted to the processor 102 of the electronic device 100. It should be understood that other configurations and inclusion or omission of various items in the electronic device 100 may be possible. The electronic device 100 is exemplary, and is not intended to limit the disclosure beyond what is explicitly recited in the claims.

As shown in FIG. 1, in some embodiments, the temperature sensor 110A is disposed on the circuit board 108 and disposed adjacent to the right side of the electric cells 106A and 106B, as well as the temperature sensor 110B is disposed on the circuit board 108 and disposed adjacent to the left side of the cells 106C and 106D. Each of the temperature sensors 110 only uses its location as a detection point to detect the battery temperatures of the battery cells 106, and the battery cells 106A, 106B, 106C, and 106D each have a large area (relative to the respective detection points of the temperature sensors 110A and 110B). Therefore, the battery temperature of the battery device 104 detected by the temperature sensors 110 is not the overall battery temperature. Therefore, a temperature compensation method is needed to reduce the difference between the battery temperature detected by the temperature sensor 110 and the simulated overall battery temperature.

Figure 2:
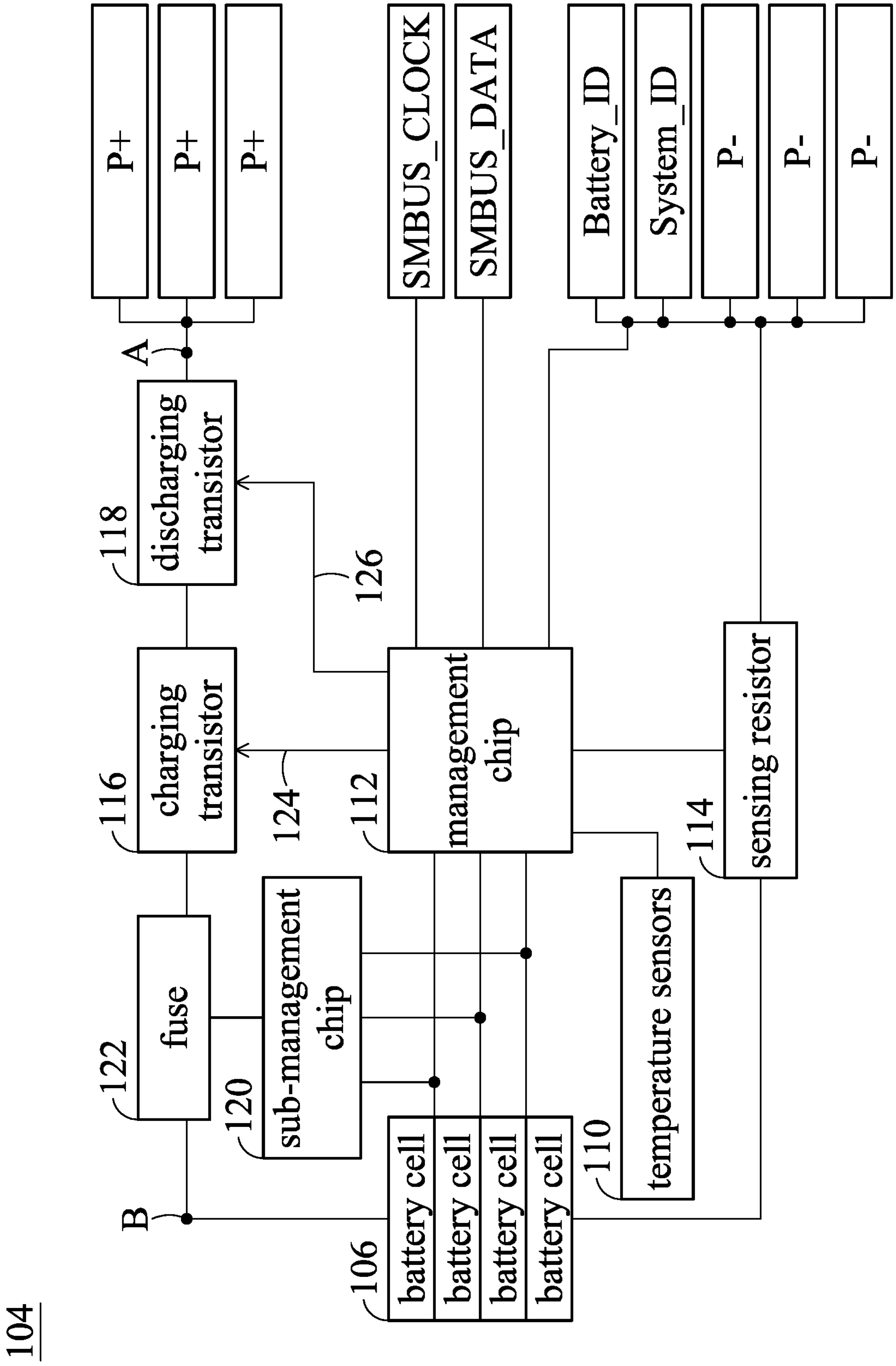
FIG. 2 illustrates a schematic diagram of a battery device, in accordance with some embodiments of the present disclosure.

FIG. 2 further illustrates a schematic diagram of a battery device 104, in accordance with some embodiments of the present disclosure. As shown in FIG. 2, the battery device 104 described above may further include the battery cells 106, the temperature sensors 110, a management chip 112, a sensing resistor 114, a charging transistor 116, a discharging transistor 118, a sub-management chip 120, and a fuse 122. It should be understood that other configurations and inclusion or omission of various items in the battery device 104 may be possible. The battery device 104 is exemplary, and is not intended to limit the disclosure beyond what is explicitly recited in the claims.

The battery cell 106 can store power. In the present embodiment, the battery cells 106 may be lithium-ion batteries. The lithium-ion battery is a rechargeable battery (secondary battery) that operates by moving lithium ions between positive and negative electrodes. The positive electrode of the lithium-ion battery is generally composed of a metal oxide containing lithium ions, and the negative electrode is generally a lattice composed of graphite. During charging, the lithium ions move toward the graphite's lattice. During discharge, the lithium ions move toward the metal oxide. The process of lithium ions entering the positive electrode (metal oxide) is called intercalation, and the process of leaving is called deintercalation; the process of lithium ions entering the negative electrode (graphite lattice) is called insertion, and the process of leaving is called extraction.

The management chip 112 is connected to the battery cells 106 to detect the voltage or capacity of the battery cells 106. The charging transistor 116 and the discharging transistor 118 are coupled between the battery cells 106 and the positive electrodes P+ of the battery device 104. The management chip 112 is connected to the charging transistor 116 and the discharging transistor 118 to control the charging transistor 116 and the discharging transistor 118, thereby controlling the charging and discharging of the battery device 104. For example, the charging transistor 116 changes its state according to the control signal sent by the management chip 112 through the control line 124. For example, when the control signal of the control line 124 is "0", the charging transistor 116 only allows the current to flow from the node B to the node A, but forbids the current to flow from the node A to the node B. When the control signal of the control line 124 is "1", the charging transistor 116 is fully turned on. In some embodiments, the discharge transistor 118 changes its state according to the control signal sent by the management chip 112 through the control line 126. For example, when the control signal of the control line 126 is "0", the discharge transistor 118 only allows the current to flow from the node A to the node B, but forbids the current to flow from the node B to the node A. When the control signal of the control line 126 is "1", the discharge transistor 118 is fully turned on.

When the battery device 104 is connected to an external power source (e.g., a DC power source, or a DC power source converted from an AC power source), and the management chip 112 transmits a control signal "1" to the charge transistor 116 and transmits a control signal "0" to the discharge transistor 118, the battery cells 106 can be connected to the external power source, so that the received power can be stored in the battery cells 106. When the management chip 112 transmits a control signal "0" to the charging transistor 116 and a control signal "0" to the discharging transistor 118, the battery cells 106 can be disconnected from the external power source, so that the battery device 104 stops being charged.

When the management chip 112 transmits a control signal "0" to the charge transistor 116 and transmits a control signal "1" to the discharge transistor 118, the battery cells 106 can be connected to the processor 102 of the electronic device 100, so that the battery device 104 can provide power to the electronic device 100. When the management chip 112 transmits a control signal "0" to the charge transistor 116 and a control signal "0" to the discharge transistor 118, the battery cells 106 can be disconnected from the electronic device 100, so that the battery device 104 stops providing power.

The management chip 112 is an integrated circuit device, which may include processor, microprocessor, controller, memory, other suitable integrated circuits, or combinations thereof. The management chip 112 may detect the voltage, capacity, etc. of the battery cells 106 (or the battery device 104), and control the battery device 104 according to the detected data.

The sensing resistor 114 is coupled to the battery cells 106, the management chip 112, and the negative electrodes P− of the battery device 104. The sensing resistor 114 may detect the discharge current of the battery device 104. In some embodiments, when the battery device 104 is connected to the processor 102 of the electronic device 100, the management chip 112 may check whether the discharge current of the battery device 104 detected by the sensing resistor 114 exceeds the protection value. When the discharge current of the battery device 104 exceeds the protection value, the management chip 112 may control the charging transistor 116 and the discharging transistor 118 to stop the battery device 104 from providing power, so as to avoid damage or danger to the battery device 104.

The fuse 122 is coupled between the battery cells 106 and the charging transistor 116. The sub-management chip 120 is coupled to the fuse 122, the management chip 112, and the battery cells 106. The sub-management chip 120 and the fuse 122 serve as the secondary protection of the battery device 104. For example, when the main management chip 112 detects that the charging transistor 116 and the discharging transistor 118 fail and cannot be turned off so that the battery device 104 stops providing power, the management chip 112 instructs the sub-management chip 120 to disconnect the fuse 122 so that the battery device 104 stops providing power. The sub-management chip 120 is also an integrated circuit device that may include a processor, a microprocessor, a controller, a memory, other suitable integrated circuits, or a combination thereof.

In the present embodiment, the battery device 104 further includes a plurality of pins. As shown in FIG. 2, the battery device 104 further includes a clock pin SMBUS_CLOCK, a data pin SMBUS_DATA, an identification pin Battery_ID, and an identification pin System_ID. The battery device 104 can communicate with the processor 102 of the electronic device 100 through the clock pin SMBUS_CLOCK and the data pin SMBUS_DATA. The identification pin Battery_ID makes the electronic device 100 powered by the battery device 104 to identify the battery device 104. The identification pin System_ID makes the battery device 104 to identify the electronic device 100 powered by the battery device 104.

Figure 3:
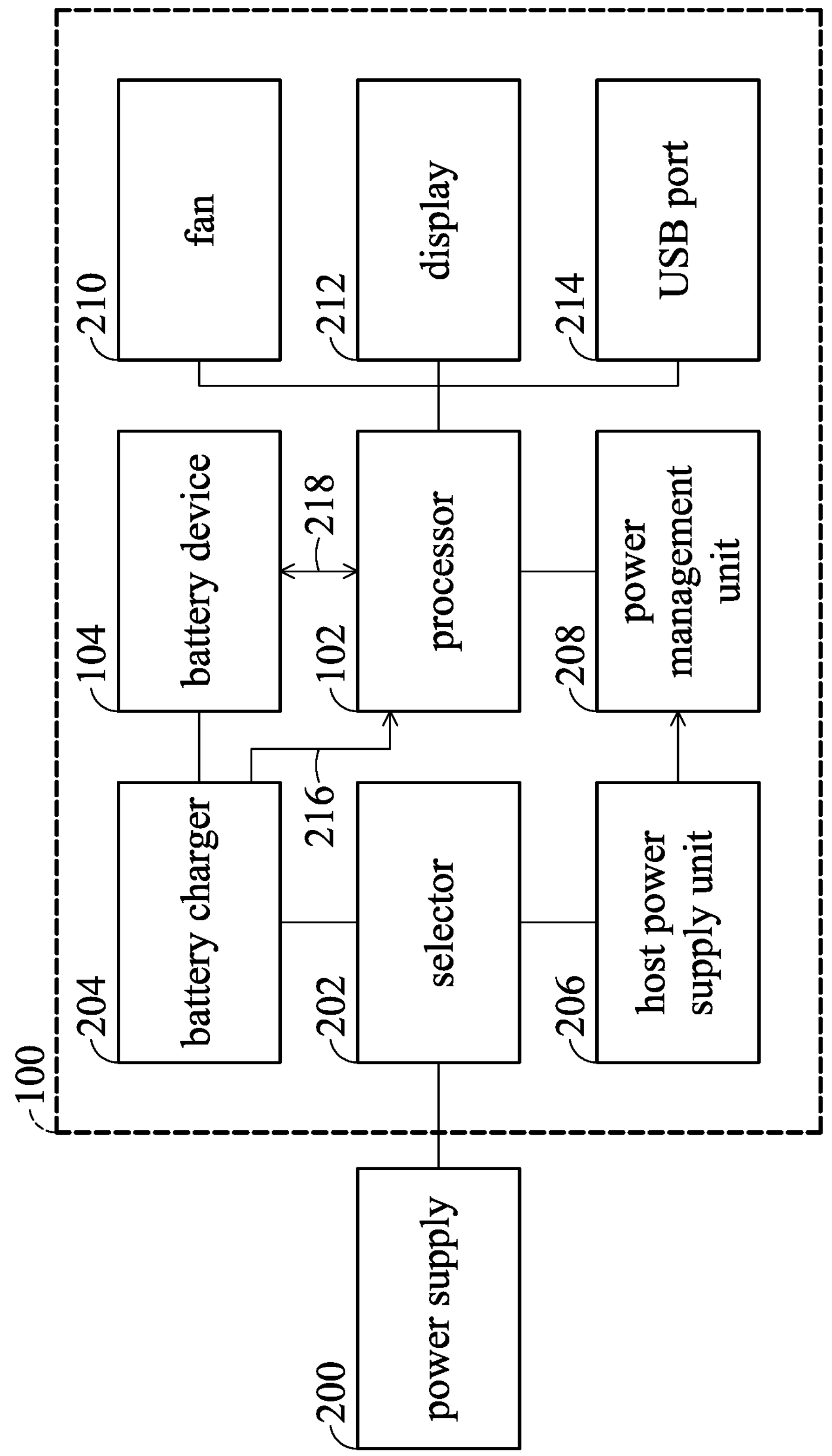
FIG. 3 illustrates a schematic diagram of the electronic device, in accordance with some embodiments of the present disclosure.

FIG. 3 further illustrates a schematic diagram of the electronic device 100, in accordance with some embodiments of the present disclosure. As shown in FIG. 3, the electronic device 100 described above may further include the processor 102, the battery device 104, a selector 202, a battery charger 204, a host power supply unit 206, a power management unit 208, at least one fan 210, a display 212, a plurality of universal serial bus (USB) ports 214.

The power supply 200 is connected to the selector 202 of the electronic device 100. The selector 202 is coupled to the battery charger 204 and the host power supply unit 206 for selecting to transmit the power provided by the power supply 200 to the battery charger 204 or the host power supply unit 206. If the selector 202 transmits power to the battery charger 204, the battery charger 204 further transmits power to the battery device 104 to charge the battery device 104. If the selector 202 transmits power to the host power supply unit 206, the host power supply unit 206 further transmits power to the power management unit 208, so that the power management unit 208 then transmits power to the processor 102 to power the electronic device 100. If the connection between the power supply 200 and the electronic device 100 is disconnected or the power supply 200 stops supplying power, the battery device 104 transmits power to the processor 102 through the battery charger 204, the selector 202, the host power supply unit 206, and the power management unit 208 to supply power to the electronic device 100. The battery device 104 is also connected to the processor 102 through a signal line 218. It should be noted that the signal line 218 only enables the battery device 104 to communicate with the processor 102, but does not enable the battery device 104 to transmit power to the processor 102. In addition, as shown in FIG. 3, the battery charger 204 is also connected to the processor 102 through a signal line 216. In some embodiments, the processor 102 is also connected to the fan 210, the display 212, and the USB ports 214.

As discussed above, the present disclosure implements a temperature compensation method to reduce the difference between the battery temperature detected by the temperature sensor 110 and the simulated overall battery temperature (which may be referred to as simulated battery temperature), so that the detected battery temperature does not exceed the simulated battery temperature too much. Specifically, the processor 102 may simulate the simulated battery temperature of the battery device 104 according to the current power consumption of the electronic device 100, and the temperature sensor 110 (shown in FIG. 2) of the battery device 104 detects the battery temperature of the battery device 104. The management chip 112 (shown in FIG. 2) of the battery device 104 then compares the simulated battery temperature with the battery temperature detected by the temperature sensor 110. If the management chip 112 determines that the difference between the detected battery temperature and the simulated battery temperature is not within a tolerance value, the electronic device 100 performs a multi-level cooling operation until the difference between the detected battery temperature of the battery device 104 and the simulated battery temperature is within the tolerance value.

The multi-level cooling operation in the embodiments of the present disclosure includes a first-level cooling operation, a second-level cooling operation, a third-level cooling operation, a fourth-level cooling operation, a fifth-level cooling operation, a sixth-level cooling operation, and a seventh-level cooling operation. Each subsequent level of the cooling operation has a higher cooling effect than the previous level of cooling operation. For example, the fifth-level cooling operation has a higher cooling effect than the fourth-level cooling operation. When one level of the cooling operations of the multi-level cooling operation performed by the electronic device 100 cannot effectively bring the difference between the detected battery temperature of the battery device 104 and the simulated battery temperature within the tolerance value, the electronic device 100 may perform the next cooling operation in the multi-level cooling operation until the difference between the detected battery temperature of the battery device 104 and the simulated battery temperature is within the tolerance value. In some embodiments, after performing one level of the cooling operations of the multi-level cooling operation, after an interval of 60 seconds, it is determined whether the difference between the detected battery temperature and the simulated battery temperature is within the tolerance value, and then it is decided whether to perform the next level of the cooling operations.

When the electronic device 100 performs the first-level cooling operation, the processor 102 increases the rotational speed of the fan 210. For example, the rotational speed of the fan 210 is increased from 1500 RPM to 3500 RPM.

When the electronic device 100 performs the second-level cooling operation, the battery device 104 instructs the processor 102 to set the operating frequency of the processor 102 at 75% of the maximum operating frequency of the processor 102 through the signal line 218. For example, if the maximum operating frequency of the processor 102 is 1200 MHz, when the electronic device 100 performs the second-level cooling operation, the operating frequency of the processor 102 is set at 900 MHz.

When the electronic device 100 performs the third-level cooling operation, the battery device 104 instructs the processor 102 to set the operating frequency of the processor 102 at 50% of the maximum operating frequency of the processor 102 through the signal line 218. For example, if the maximum operating frequency of the processor 102 is 1200 MHz, when the electronic device 100 performs the third-level cooling operation, the operating frequency of the processor 102 is set at 600 MHz.

When the electronic device 100 performs the fourth-level cooling operation, the battery device 104 instructs the processor 102 to set the operating frequency of the processor 102 at 25% of the maximum operating frequency of the processor 102 through the signal line 218. For example, if the maximum operating frequency of the processor 102 is 1200 MHz, when the electronic device 100 performs the fourth-level cooling operation, the operating frequency of the processor 102 is set at 300 MHz.

When the electronic device 100 performs the fifth-level cooling operation, the battery device 104 instructs the processor 102 to set the operating frequency of the processor 102 below 25% of the maximum operating frequency of the processor 102 through the signal line 216. For example, if the maximum operating frequency of the processor 102 is 1200 MHz, when the electronic device 100 performs the fifth-level cooling operation, the operating frequency of the processor 102 is set below 300 MHz.

It should be noted that the second-level cooling operation to the fourth-level cooling operation are performed by the battery device 104 instructing the processor 102 through the signal line 218, and the fifth-level cooling operation is performed by the battery charger 204 instructing the processor 102 through the signal line 216. When the processor 102 receives an instruction from the battery device 104, the processor 102 sets the operating frequency of the processor 102 with a software mechanism, and when the processor 102 receives an instruction from the battery charger 204, the processor 102 sets the operating frequency of the processor 102 by a hardware mechanism. Compared with the software mechanism, the speed of setting the operating frequency by the hardware mechanism is faster. Therefore, the fifth-level cooling operation can reduce the battery temperature of the battery device 104 more urgently and effectively.

In some embodiments, when the current operating frequency of the processor 102 is already lower than the operating frequency to be set for the cooling operation, the next level of the cooling operations is performed. For example, as discussed above, if the maximum operating frequency of the processor 102 is 1200 MHz, when the electronic device 100 performs the third-level cooling operation, the operating frequency of the processor 102 is set at 600 MHz. However, if the current operating frequency of the processor 102 is already lower than 600 MHz (such as 500 MHz) when the third-level cooling operation is performed, the next level of the cooling operations (e.g., the fourth-level cooling operation) is performed, and the operating frequency of the processor 102 is set at 300 MHz.

When the electronic device 100 performs the sixth-level cooling operation, the processor 102 reduces the brightness of the display 212. For example, the brightness of the display 212 is reduced from 80 to 50.

When the electronic device 100 performs the seventh-level cooling operation, the processor 102 closes the USB ports 214. For example, close the USB ports 214, so that the external device(s) connected to the electronic device 100 through the USB port(s) 214 is disconnected from the electronic device 100, such as keyboard, mouse, microphone, external hard drive, USB storage device, etc.

Figure 4:
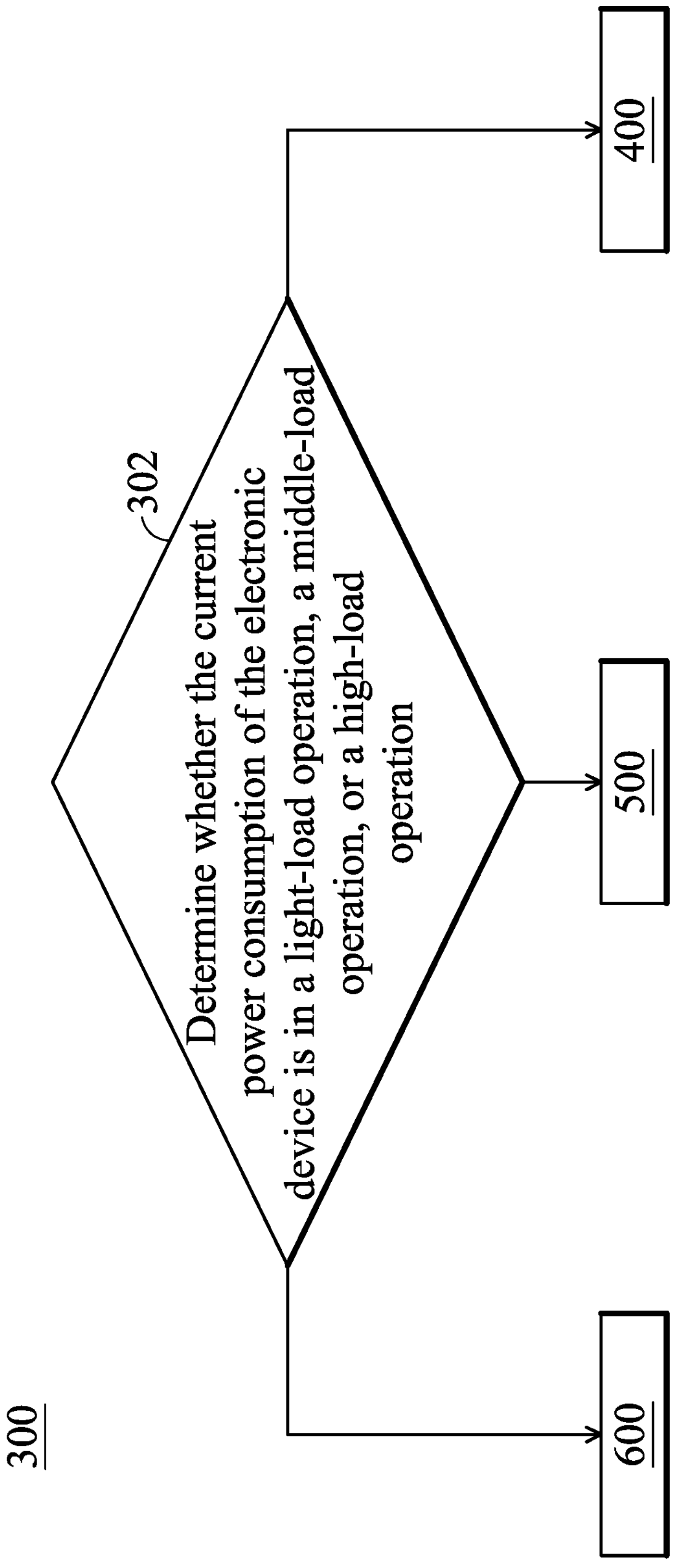
FIG. 4 illustrates a flow chart of a battery temperature compensation method, in accordance with some embodiments of the present disclosure, which shows a method for classifying the electronic device as being in a light-load operation, a middle-load operation, or a high-load operation.

FIG. 4 illustrates a flow chart of a battery temperature compensation method 300, in accordance with some embodiments of the present disclosure, which shows a method for classifying the electronic device 100 as being in a light-load operation, a middle-load operation, or a high-load operation. In operation 302, the processor 102 determines whether the current power consumption of the electronic device 100 is in a light-load operation, a middle-load operation, or a high-load operation. Specifically, when the current power consumption of the electronic device 100 is between 1% and 35% of the maximum power consumption of the electronic device 100, the processor 102 determines that the electronic device 100 is in the light-load operation. When the current power consumption of the electronic device 100 is between 36% and 75% of the maximum power consumption of the electronic device 100, the processor 102 determines that the electronic device 100 is in the middle-load operation. When the current power consumption of the electronic device 100 is between 76% and 100% of the maximum power consumption of the electronic device 100, the processor 102 determines that the electronic device 100 is in high-load operation. In other words, the light-load operation is defined as between 1% and 35% of the maximum power consumption of the electronic device 100, the middle-load operation is defined as between 36% and 75% of the maximum power consumption of the electronic device 100, and the high-load operation is defined as between 76% and 100% of the maximum power consumption of the electronic device 100.

Figure 5:
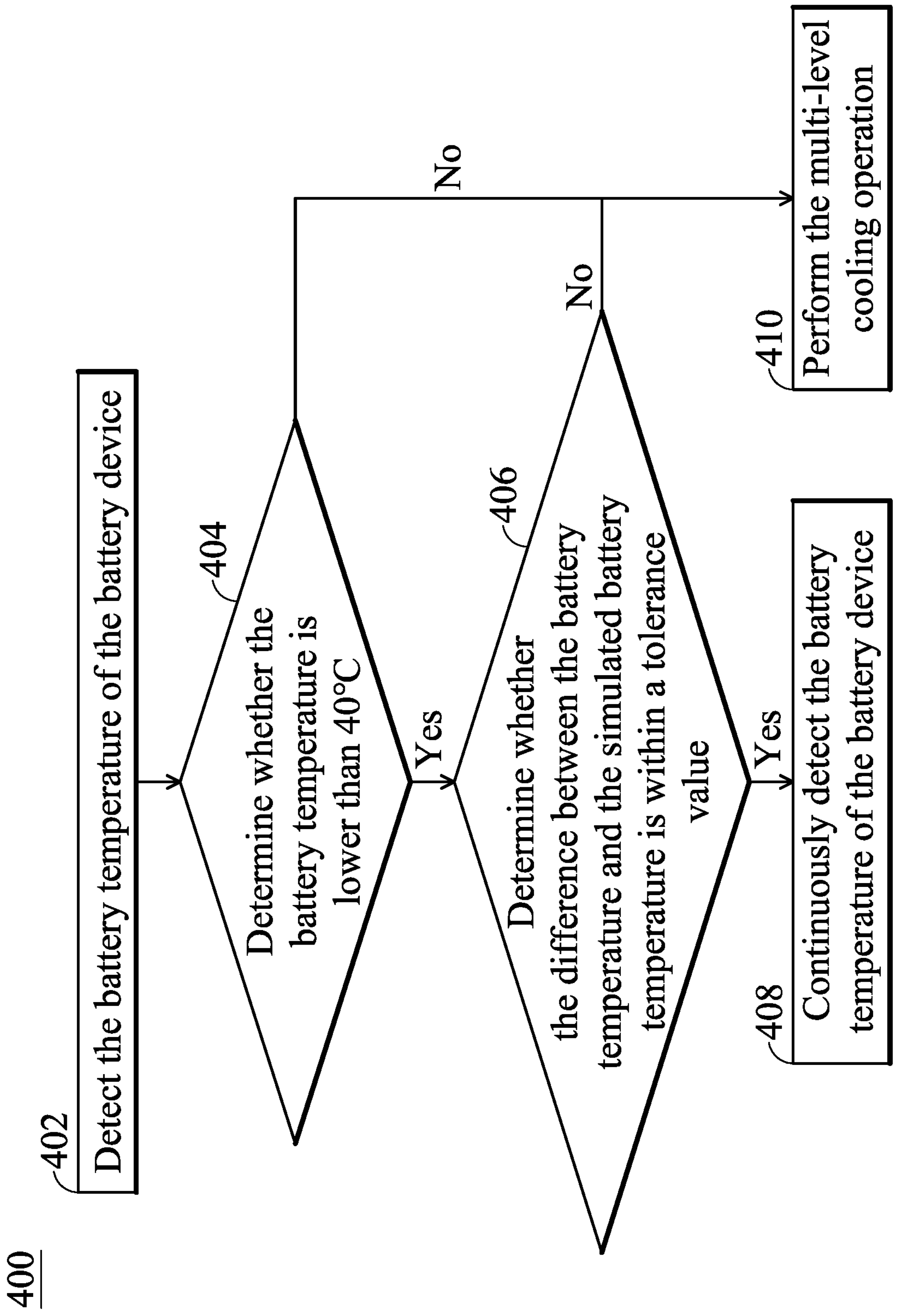
FIG. 5 illustrates a flow chart of the battery temperature compensation method, in accordance with some embodiments of the present disclosure, which shows the battery temperature compensation method of the electronic device in the light-load operation.

As shown in FIG. 4, when it is determined that the electronic device 100 is operating in the light-load operation, the battery temperature compensation method 400 is performed. When it is determined that the electronic device 100 is operating in the middle-load operation, the battery temperature compensation method 500 is performed. When it is determined that the electronic device 100 is operating in the high-load operation, the battery temperature compensation method 600 is performed. FIG. 5 illustrates a flow chart of the battery temperature compensation method 400, in accordance with some embodiments of the present disclosure, which shows the battery temperature compensation method of the electronic device 100 in the light-load operation. In operation 402, the battery temperature of the battery device 104 in the electronic device 100 is detected. Specifically, the temperature sensor 110 in the battery device 104 can detect the battery temperature of the battery device 104. In some embodiments, the temperature sensor 110 detects the battery temperature of the battery device 104 every 60 seconds.

In operation 404, the management chip 112 of the battery device 104 determines whether the battery temperature detected by the temperature sensor 110 is lower than 40° C. If yes, the battery temperature compensation method 400 proceeds to operation 406; if no, the battery temperature compensation method 400 proceeds to operation 410.

In operation 406, the management chip 112 of the battery device 104 determines whether the difference between the battery temperature detected by the temperature sensor 110 and the simulated battery temperature of the battery device 104 is within a tolerance value. If yes, the battery temperature compensation method 400 proceeds to operation 408; if no, the battery temperature compensation method 400 proceeds to operation 410. In some embodiments, this tolerance value in light-load operation is set lower than 3° C., but is not limited thereto. For example, assuming that the simulated battery temperature of the battery device 104 is 33° C., when the battery temperature detected by the temperature sensor 110 is 35° C., the difference is within the tolerance value, and the battery temperature compensation method 400 proceeds to operation 408. On the contrary, assuming that the simulated battery temperature of the battery device 104 is 33° C., when the battery temperature detected by the temperature sensor 110 is 37° C., the difference is not within the tolerance value, and the battery temperature compensation method 400 proceeds to operation 410. In some embodiments, the simulated battery temperature of the battery device 104 is simulated by the processor 102 according to the current power consumption of the electronic device 100. In other embodiments, the simulated battery temperature of the battery device 104 is pre-simulated data stored in the electronic device 100 in advance.

In operation 408, when it is determined that the difference between the battery temperature detected by the temperature sensor 110 of the battery device 104 and the simulated battery temperature is within the tolerance value (e.g., lower than 3° C.), the temperature sensor 110 continuously detects the battery temperature of the battery device 104. In other words, it may return to operation 402 to detect the battery temperature of the battery device 104. In some embodiments, it may return to operation 302 of the battery temperature compensation method 300 to re-determine whether the current power consumption of the electronic device 100 is in light-load operation, middle-load operation, or high-load operation.

In operation 410, the multi-level cooling operation discussed above is performed. In some embodiments, when the management chip 112 of the battery device 104 determines that the temperature of the battery detected by the temperature sensor 110 is not lower than 40° C., the multi-level cooling operation discussed above is performed until the battery temperature of the battery device 104 is reduced to lower than 40° C. In other embodiments, when it is determined that the difference between the battery temperature detected by the temperature sensor 110 and the simulated battery temperature of the battery device 104 is not within the tolerance value (e.g., greater than or equal to 3° C.), the multi-level cooling operation discussed above is performed until the difference between the battery temperature detected by the temperature sensor 110 and the simulated battery temperature of the battery device 104 is within the tolerance value (e.g., lower than 3° C.).

Figure 6A:
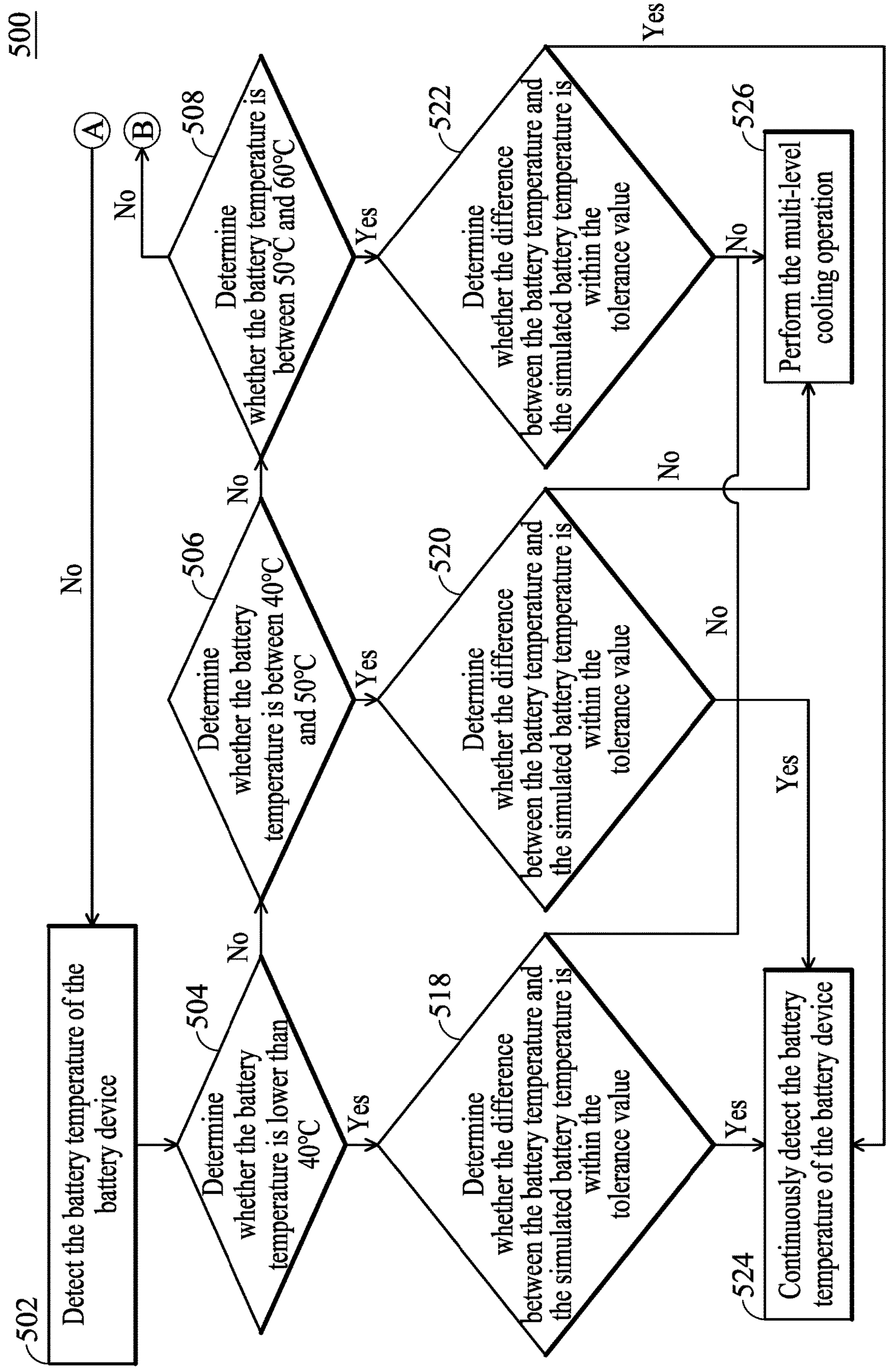
FIGS. 6A and 6B illustrate a flow chart of the battery temperature compensation method, in accordance with some embodiments of the present disclosure, which shows the battery temperature compensation method of the electronic device in the middle-load operation.
Figure 6B:
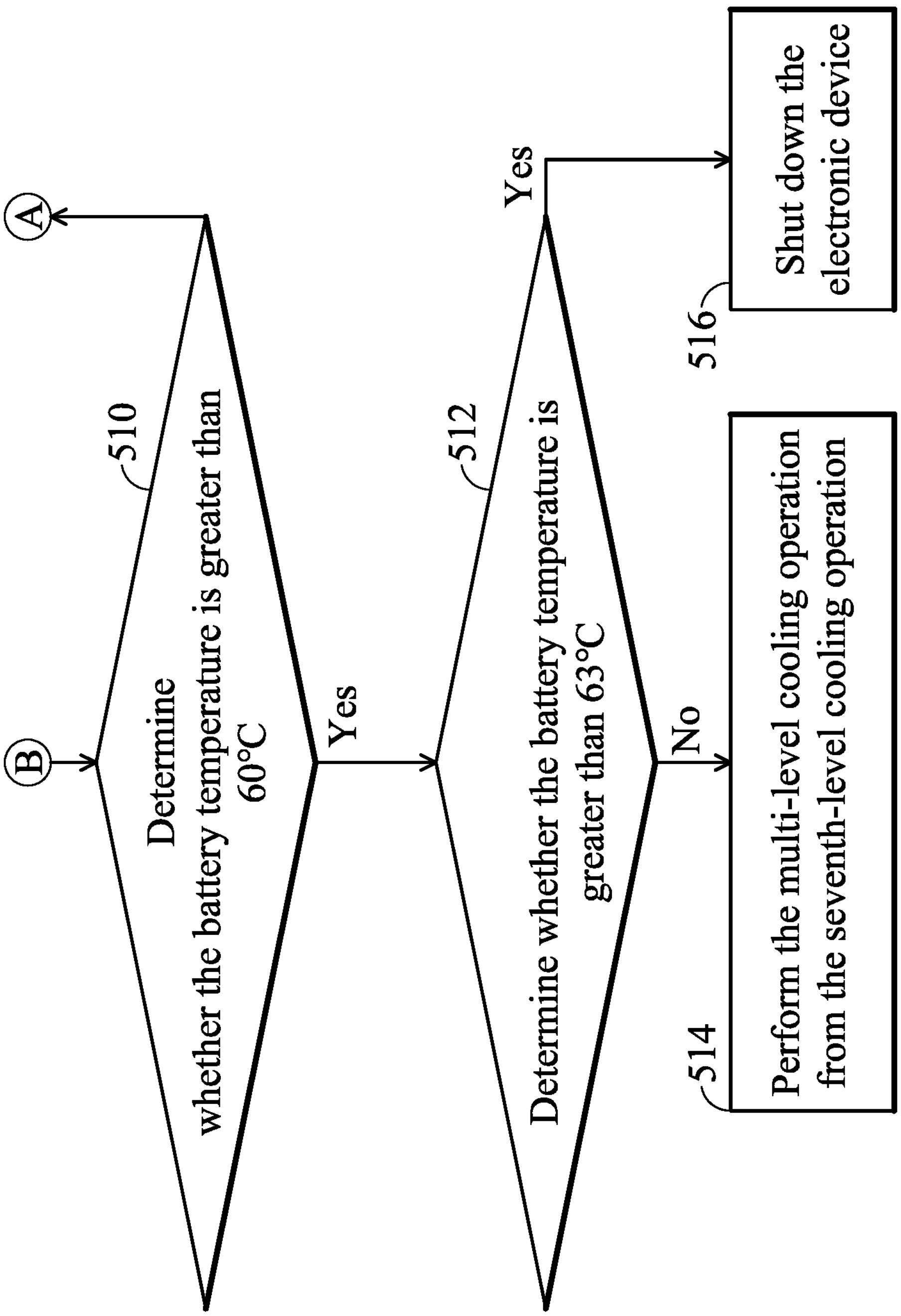

FIGS. 6A and 6B illustrate a flow chart of the battery temperature compensation method 500, in accordance with some embodiments of the present disclosure, which shows the battery temperature compensation method of the electronic device 100 in the middle-load operation. In operation 502, the battery temperature of the battery device 104 in the electronic device 100 is detected. Specifically, the temperature sensor 110 in the battery device 104 can detect the battery temperature of the battery device 104. In some embodiments, the temperature sensor 110 detects the battery temperature of the battery device 104 every 60 seconds.

In operation 504, the management chip 112 of the battery device 104 determines whether the battery temperature detected by the temperature sensor 110 is lower than 40° C. If yes, the battery temperature compensation method 500 proceeds to operation 518; if no, the battery temperature compensation method 500 proceeds to operation 506.

In operation 506, the management chip 112 of the battery device 104 determines whether the battery temperature detected by the temperature sensor 110 is between 40° C. and 50° C. If yes, the battery temperature compensation method 500 proceeds to operation 520; if no, the battery temperature compensation method 500 proceeds to operation 508.

In operation 508, the management chip 112 of the battery device 104 determines whether the battery temperature detected by the temperature sensor 110 is between 50° C. and 60° C. If yes, the battery temperature compensation method 500 proceeds to operation 522; if no, the battery temperature compensation method 500 proceeds to operation 510.

In operation 510, the management chip 112 of the battery device 104 determines whether the battery temperature detected by the temperature sensor 110 is greater than 60° C. If yes, the battery temperature compensation method 500 proceeds to operation 512; if no, since operation 508 has determined that the battery temperature is not between 50° C. and 60° C., an error may occur in the detection, and the battery temperature compensation method 500 proceeds to operation 502 to again detect the battery temperature of the battery device 104 in the electronic device 100.

In operation 512, the management chip 112 of the battery device 104 determines whether the battery temperature detected by the temperature sensor 110 is greater than 63° C. If yes, the battery temperature compensation method 500 proceeds to operation 516; if no, the battery temperature compensation method 500 proceeds to operation 514.

In operation 514, the multi-level cooling operation discussed above is performed. However, it should be noted that since the battery temperature of the battery device 104 has exceeded 60° C., it is necessary to quickly and effectively reduce the battery temperature. Therefore, in operation 514, the processor 102 closes the USB ports 214 to perform the multi-level cooling operation from the seventh-level cooling operation.

In operation 516, since the battery temperature of the battery device 104 has exceeded 63° C., the electronic device 100 needs to be shut down, so as to avoid damage to the battery device 104 or damage to the electronic device 100 caused by the battery device 104.

In operations 518, 520, 522, the management chip 112 of the battery device 104 determines whether the difference between the battery temperature detected by the temperature sensor 110 and the simulated battery temperature of the battery device 104 is within the tolerance value. If yes, the battery temperature compensation method 500 proceeds to operation 524; if no, the battery temperature compensation method 500 proceeds to operation 526. In some embodiments, this tolerance value in middle-load operation is set lower than 5° C., but is not limited thereto.

In operation 524, when it is determined that the difference between the battery temperature detected by the temperature sensor 110 and the simulated battery temperature of the battery device 104 is within the tolerance value (e.g., lower than 5° C.), the temperature sensor 110 continuously detects the battery temperature of the battery device 104. In other words, it may return to operation 502 to detect the battery temperature of the battery device 104. In some embodiments, it may return to operation 302 of the battery temperature compensation method 300 to re-determine whether the current power consumption of the electronic device 100 is in light-load operation, middle-load operation, or high-load operation.

In operation 526, the multi-level cooling operation discussed above is performed. In other embodiments, when it is determined that the difference between the battery temperature detected by the temperature sensor 110 and the simulated battery temperature of the battery device 104 is not within the tolerance value (e.g., greater than or equal to 5° C.), the multi-level cooling operation discussed above is performed until the difference between the battery temperature detected by the temperature sensor 110 and the simulated battery temperature of the battery device 104 is within the tolerance value (e.g., lower than 5° C.).

Figure 7A:
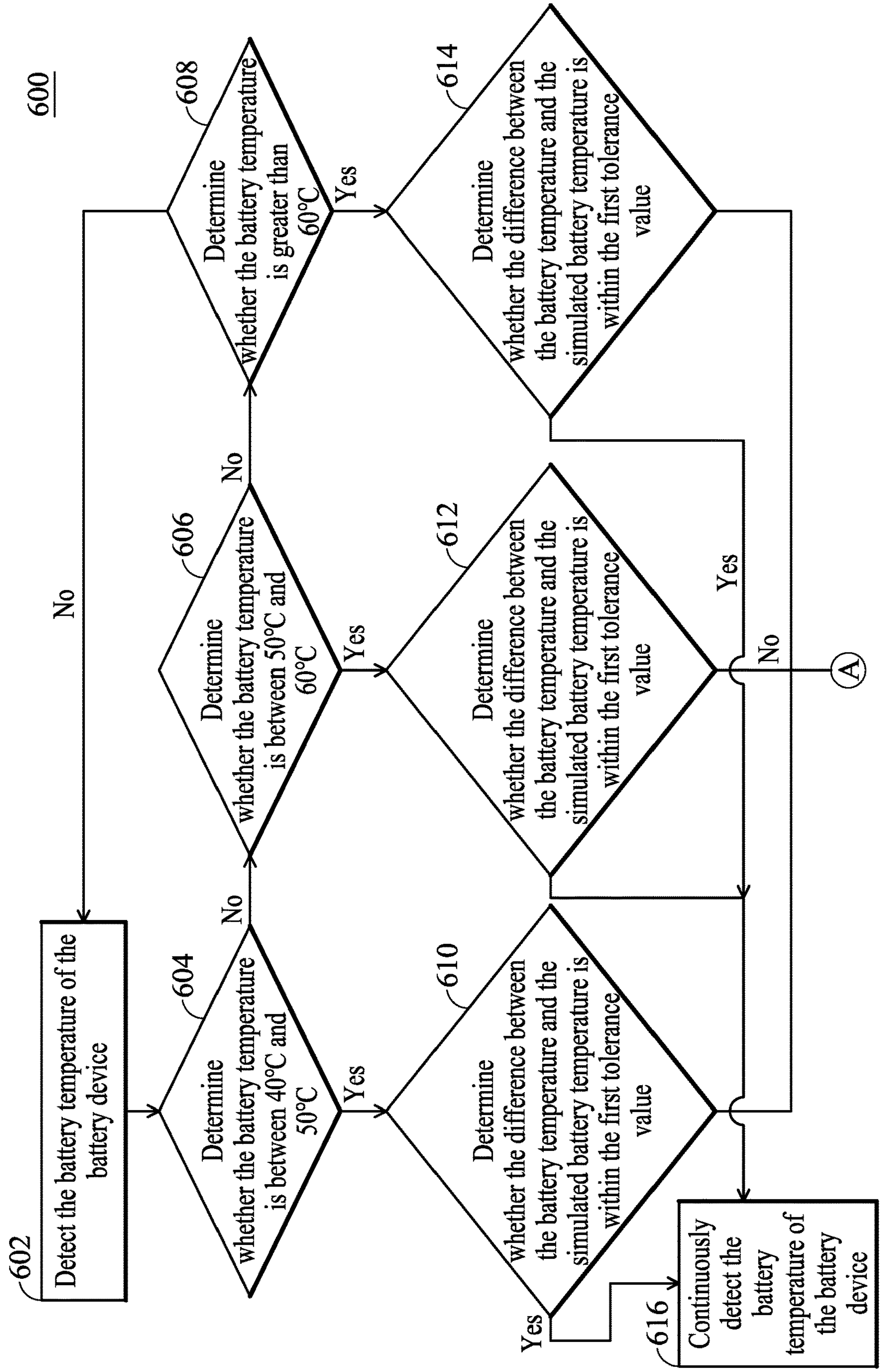
FIGS. 7A and 7B illustrate a flow chart of the battery temperature compensation method, in accordance with some embodiments of the present disclosure, which shows the battery temperature compensation method of the electronic device in the high-load operation.
Figure 7B:
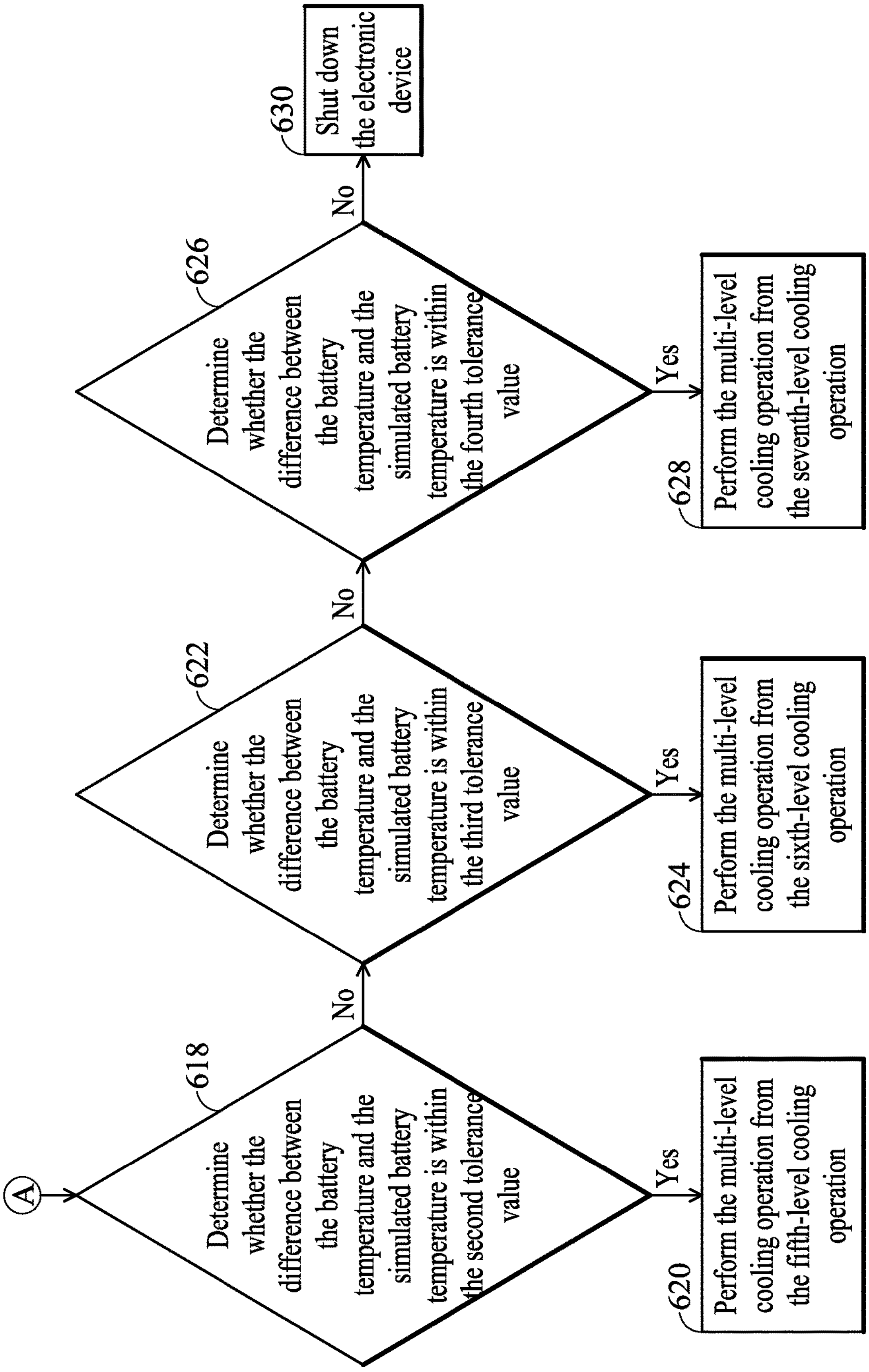

FIGS. 7A and 7B illustrate a flow chart of the battery temperature compensation method 600, in accordance with some embodiments of the present disclosure, which shows the battery temperature compensation method of the electronic device 100 in the high-load operation. In operation 602, the battery temperature of the battery device 104 in the electronic device 100 is detected. Specifically, the temperature sensor 110 in the battery device 104 can detect the battery temperature of the battery device 104. In some embodiments, the temperature sensor 110 detects the battery temperature of the battery device 104 every 60 seconds.

In operation 604, the management chip 112 of the battery device 104 determines whether the battery temperature detected by the temperature sensor 110 is between 40° C. and 50° C. If yes, the battery temperature compensation method 600 proceeds to operation 610; if no, the battery temperature compensation method 600 proceeds to operation 606.

In operation 606, the management chip 112 of the battery device 104 determines whether the battery temperature detected by the temperature sensor 110 is between 50° C. and 60° C. If yes, the battery temperature compensation method 600 proceeds to operation 612; if no, the battery temperature compensation method 600 proceeds to operation 608.

In operation 608, the management chip 112 of the battery device 104 determines whether the battery temperature detected by the temperature sensor 110 is greater than 60° C. If yes, the battery temperature compensation method 600 proceeds to operation 614; if no, since operation 508 has determined that the battery temperature is not between 50° C. and 60° C., an error may occur in the detection, and the battery temperature compensation method 600 proceeds to operation 602 to again detect the battery temperature of the battery device 104 in the electronic device 100.

In operations 610, 612, 614, the management chip 112 of the battery device 104 determines whether the difference between the battery temperature detected by the temperature sensor 110 and the simulated battery temperature of the battery device 104 is within a first tolerance value. If yes, the battery temperature compensation method 600 proceeds to operation 616; if no, the battery temperature compensation method 600 proceeds to operation 618. In some embodiments, this first tolerance value in high-load operation is set lower than 8° C., but is not limited thereto.

In operation 606, when it is determined that the difference between the battery temperature detected by the temperature sensor 110 and the simulated battery temperature of the battery device 104 is within the tolerance value (e.g., lower than 8° C.), the temperature sensor 110 continuously detects the battery temperature of the battery device 104. In other words, it may return to operation 602 to detect the battery temperature of the battery device 104. In some embodiments, it may return to operation 302 of the battery temperature compensation method 300 to re-determine whether the current power consumption of the electronic device 100 is in light-load operation, middle-load operation, or high-load operation.

In operation 618, the management chip 112 of the battery device 104 determines whether the difference between the battery temperature detected by the temperature sensor 110 and the simulated battery temperature of the battery device 104 is within a second tolerance value. If yes, the battery temperature compensation method 600 proceeds to operation 620; if no, the battery temperature compensation method 600 proceeds to operation 622. In some embodiments, this second tolerance value in high-load operation is set lower than 9° C., but is not limited thereto.

In operation 620, the multi-level cooling operation discussed above is performed. However, it should be noted that in order to quickly and effectively reduce the battery temperature, in operation 620, the multi-level cooling operation is performed from the fifth-level cooling operation, and the operating frequency of the processor 102 is set below 25% of the maximum operating frequency of the processor 102.

In operation 622, the management chip 112 of the battery device 104 determines whether the difference between the battery temperature detected by the temperature sensor 110 and the simulated battery temperature of the battery device 104 is within a third tolerance value. If yes, the battery temperature compensation method 600 proceeds to operation 624;

if no, the battery temperature compensation method 600 proceeds to operation 626. In some embodiments, this third tolerance value in high-load operation is set lower than 10° C., but is not limited thereto.

In operation 624, the multi-level cooling operation discussed above is performed. However, it should be noted that in order to quickly and effectively reduce the battery temperature, in operation 624, the multi-level cooling operation is performed from the sixth-level cooling operation, and the brightness of the display 212 is reduced.

In operation 626, the management chip 112 of the battery device 104 determines whether the difference between the battery temperature detected by the temperature sensor 110 and the simulated battery temperature of the battery device 104 is within a fourth tolerance value. If yes, the battery temperature compensation method 600 proceeds to operation 628; if no, the battery temperature compensation method 600 proceeds to operation 630. In some embodiments, this fourth tolerance value in high-load operation is set lower than 11° C., but is not limited thereto.

In operation 628, the multi-level cooling operation discussed above is performed. However, it should be noted that in order to quickly and effectively reduce the battery temperature, in operation 628, the multi-level cooling operation is performed from the seventh-level cooling operation, and the processor 102 closes the USB ports 214.

In operation 630, since the battery temperature of the battery device 104 has exceeded 60° C. and the difference between the battery temperature of the battery device 104 and the simulated battery temperature is greater than or equal to 11° C. (the battery temperature is over 71° C.), the electronic device 100 needs to be shut down, so as to avoid damage to the battery device 104 or damage to the electronic device 100 caused by the battery device 104.

The embodiments of the present disclosure offer advantages over existing art, though it should be understood that other embodiments may offer different advantages, not all advantages are necessarily discussed herein, and that no particular advantage is required for all embodiments. By using the embodiments of the present disclosure, the devices and methods of the present disclosure may quickly compensate the battery temperature of the battery device to match the detected battery temperature to the simulated battery temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A smart battery temperature compensation method, comprising:

detecting a battery temperature of a battery device in an electronic device;

determining whether a difference between the battery temperature and a simulated battery temperature of the battery device is within a tolerance value, wherein the simulated battery temperature is simulated according to a current power consumption of the electronic device; and when it is determined that the difference between the battery temperature of the battery device and the simulated battery temperature is not within the tolerance value, performing a multi-level cooling operation until the difference between the battery temperature of the battery device and the simulated battery temperature is within the tolerance value;

wherein the multi-level cooling operation comprises:

a first-level cooling operation, increasing a rotational speed of at least one fan of the electronic device;

a second-level cooling operation, setting an operating frequency of a processor of the electronic device at 75% of a maximum operating frequency;

a third-level cooling operation, setting the operating frequency of the processor of the electronic device at 50% of the maximum operating frequency;

a fourth-level cooling operation, setting the operating frequency of the processor of the electronic device at 25% of the maximum operating frequency;

a fifth-level cooling operation, setting the operating frequency of the processor of the electronic device below 25% of the maximum operating frequency;

a sixth-level cooling operation, reducing a brightness of a display of the electronic device; and a seventh-level cooling operation, closing a plurality of universal serial bus ports of the electronic devices;

wherein each subsequent level of the cooling operation has a higher cooling effect than the previous level of the cooling operation, wherein when performing one level of the cooling operations of the multi-level cooling operation cannot bring the difference between the battery temperature of the battery device and the simulated battery temperature within the tolerance value, a next level of the cooling operations of the multi-level cooling operation is performed.

2. The smart battery temperature compensation method as claimed in claim 1, further comprising:

determining whether the current power consumption of the electronic device is in a light-load operation, a middle-load operation, or a high-load operation;

wherein the light-load operation is when the current power consumption of the electronic device is between 1% and 35% of a maximum power consumption of the electronic device;

wherein the middle-load operation is when the current power consumption of the electronic device is between 36 and 75% of the maximum power consumption of the electronic device, and wherein the high-load operation is when the current power consumption of the electronic device is between 76% and 100% of the maximum power consumption of the electronic device.

3. The smart battery temperature compensation method as claimed in claim 2, wherein when it is determined that the electronic device is in the light-load operation, the tolerance value is less than 3° C.

4. The smart battery temperature compensation method as claimed in claim 2, wherein when it is determined that the electronic device is in the middle-load operation, the tolerance value is less than 5° C.

5. The smart battery temperature compensation method as claimed in claim 2, wherein when it is determined that the electronic device is in the high-load operation, the tolerance value is less than 8° C.

6. The smart battery temperature compensation method as claimed in claim 5, further comprising:

when the difference between the battery temperature of the battery device and the simulated battery temperature is not within the tolerance value, determining whether the difference is less than 9° C.; and when it is determined that the difference is less than 9° C., performing the multi-level cooling operation from the fifth-level cooling operation until the difference between the battery temperature of the battery device and the simulated battery temperature is within the tolerance value.

7. The smart battery temperature compensation method as claimed in claim 5, further comprising:

when the difference between the battery temperature of the battery device and the simulated battery temperature is not within the tolerance value, determining whether the difference is less than 10° C.; and when it is determined that the difference is less than 10° C., performing the multi-level cooling operation from the sixth-level cooling operation until the difference between the battery temperature of the battery device and the simulated battery temperature is within the tolerance value.

8. The smart battery temperature compensation method as claimed in claim 5, further comprising:

when the difference between the battery temperature of the battery device and the simulated battery temperature is not within the tolerance value, determining whether the difference is less than 11° C.; and when it is determined that the difference is less than 11° C., performing the multi-level cooling operation from the seventh-level cooling operation until the difference between the battery temperature of the battery device and the simulated battery temperature is within the tolerance value.

9. The smart battery temperature compensation method as claimed in claim 8, further comprising:

when it is determined that the difference is greater than 11° C., turning off the electronic device.

* * * * *